US009929647B1

(12) United States Patent
Jeong et al.

(10) Patent No.: US 9,929,647 B1
(45) Date of Patent: Mar. 27, 2018

(54) CIRCUIT AND METHOD FOR PROTECTING CIRCUIT ELEMENT, VEHICLE HAVING THE CIRCUIT, AND METHOD FOR CONTROLLING THE VEHICLE

(71) Applicant: Hyundai Motor Company, Seoul (KR)

(72) Inventors: Kangho Jeong, Gyeongsangnam-do (KR); Jiwoong Jang, Gyeonggi-do (KR); Ki Jong Lee, Gyeonggi-do (KR); Sangcheol Shin, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/590,400

(22) Filed: May 9, 2017

(30) Foreign Application Priority Data

Dec. 16, 2016 (KR) .......................... 10-2016-0172162

(51) Int. Cl.
| | |
|---|---|
| *H02M 1/32* | (2007.01) |
| *H02M 3/156* | (2006.01) |
| *H03K 17/687* | (2006.01) |
| *G05F 1/46* | (2006.01) |
| *H02P 6/10* | (2006.01) |
| *H03H 11/48* | (2006.01) |
| *H03K 5/00* | (2006.01) |
| *H02M 7/5387* | (2007.01) |

(52) U.S. Cl.
CPC ............ *H02M 3/156* (2013.01); *G05F 1/461* (2013.01); *H02M 1/32* (2013.01); *H02P 6/10* (2013.01); *H03H 11/48* (2013.01); *H03K 17/6871* (2013.01); *H02M 7/5387* (2013.01); *H03K 2005/00019* (2013.01)

(58) Field of Classification Search
CPC .............................. H02M 1/32; H02M 7/5387
See application file for complete search history.

(56) References Cited

U.S. PATENT DOCUMENTS

| | | | |
|---|---|---|---|
| 5,926,012 A * | 7/1999 | Takizawa | ........... H03K 17/0828 323/284 |
| 7,983,013 B2 | 7/2011 | Huang et al. | |
| 9,366,717 B2 | 6/2016 | Ratz | |
| 2004/0027762 A1 | 2/2004 | Ohi et al. | |

(Continued)

FOREIGN PATENT DOCUMENTS

| | | |
|---|---|---|
| JP | 2015-53749 A | 3/2015 |
| JP | 2015-201980 A | 11/2015 |
| KR | 2015-0071576 A | 6/2015 |

*Primary Examiner* — Timothy J Dole
*Assistant Examiner* — Ishrat Jamali
(74) *Attorney, Agent, or Firm* — Mintz Levin Cohn Ferris Glovsky and Popeo, P.C.; Peter F. Corless (57) ABSTRACT

A circuit and method for protecting circuit elements, vehicle having the circuit, and method for controlling the vehicle are provided. The circuit for protecting circuit elements includes a circuit element, a driving signal generator that applies a driving voltage to the circuit element and an inductor with a first terminal electrically connected to the circuit element. A circuit protector obtains information regarding the driving voltage applied to the circuit element and a differential voltage across the first terminal and a second terminal of the inductor, compares the driving voltage applied to the circuit element with a first reference voltage, compares the differential voltage with a second reference voltage, and then transmits a control signal to the driving signal generator according to the comparison results.

16 Claims, 8 Drawing Sheets

(56) References Cited

U.S. PATENT DOCUMENTS

2009/0067109 A1\* 3/2009 Huang ............... H03K 17/0828
  361/93.1
2015/0155700 A1 6/2015 Alvarez Valenzuela et al.
2016/0124037 A1 5/2016 Zhang et al.

\* cited by examiner

CIRCUIT AND METHOD FOR PROTECTING CIRCUIT ELEMENT, VEHICLE HAVING THE CIRCUIT, AND METHOD FOR CONTROLLING THE VEHICLE

CROSS-REFERENCE TO RELATED APPLICATION

This application claims priority to and the benefit of Korean Patent Application No. 10-2016-0172162, filed on Dec. 16, 2016, the disclosure of which is incorporated herein by reference in its entirety.

BACKGROUND

1. Field of the Disclosure

The present disclosure relates to circuit and method for protecting circuit elements, vehicle having the circuit, and method for controlling the vehicle, and more particularly, to a circuit protection that overcomes a short circuit by more rapidly and reliably detecting an overcurrent applied to a circuit element.

2. Discussion of Related Art

Generally, vehicles are driven to move on the roads or tracks by driving one or more wheels equipped on the body of the vehicle. Vehicles may be classified into e.g., three- or four-wheel vehicles, a two-wheel vehicle such as a motorcycle, construction machinery, bicycles, trains traveling along rails on the tracks, and the like.

A motor is mounted inside the vehicle to have power required for operation of the vehicle. The motor mounted within the vehicle may include, e.g., a direct current (DC) motor, an alternate current (AC) motor, a DC brushless motor, or a linear inductive motor. The motor performs various functions based on installation positions or purposes. For example, a motor installed in an oil pump may circulate oil to be supplied to an engine or transmission requiring the oil, e.g., engine oil or transmission oil. Furthermore, a motor installed in an electric vehicle may allow the vehicle to obtain power required to turn the wheels by transforming electric energy charged in a battery in the vehicle to mechanical energy.

SUMMARY

The present disclosure provides a circuit and method for protecting circuit elements, and vehicle having the circuit and method for controlling the vehicle, to appropriately cope with a short circuit by more rapidly and more reliably detecting an overcurrent applied to a circuit element.

According to one aspect, a circuit for protecting circuit elements may include a circuit element, a driving signal generator configured to apply a driving voltage to the circuit element, an inductor with a first terminal electrically connected to the circuit element and a circuit protector configured to obtain information regarding the driving voltage applied to the circuit element and a differential voltage across the first terminal and a second terminal of the inductor, compare the driving voltage applied to the circuit element with a first reference voltage, compare the differential voltage with a second reference voltage, and transmit a control signal to the driving signal generator according to the comparison results.

The circuit protector may include a differential voltage sensor configured to determine a difference between a voltage applied to the inductor and a voltage output from the inductor. The circuit protector may further include a first comparator configured to compare the driving voltage with the first reference voltage, and a first latch configured to operate based on an output of the first comparator. The circuit protector may also include a second comparator connected to the differential voltage sensor and configured to compare the differential voltage with the second reference voltage, and a second latch configured to operate based on an output of the second comparator.

Additionally, the circuit protector may include an AND gate element connected to the first and second latches. The circuit element may include at least one transistor, the transistor having at least one of Bipolar Junction Transistor (BJT), thyristor, Field-Effect Transistor (FET) and Insulated Gate Bipolar mode Transistor (IGBT). The driving signal generator may be configured to apply the driving voltage to a base or gate of the at least one transistor. The driving signal generator may be configured to stop applying voltage to the circuit element or change the driving voltage, in response to a control signal received from the circuit protector.

A vehicle may include at least one circuit element, a driving signal generator configured to apply a driving voltage to the at least one circuit element and a controller configured to receive the driving voltage applied to the circuit element, measure a change in voltage of an electric signal output from the circuit element, compare the driving voltage applied to the circuit element with a first reference voltage, compare the change in voltage with a second reference voltage, and transmit a control signal to the driving signal generator according to the comparison results. The circuit element may include at least one switching element of a motor driver connected to a coil of a motor. The motor may be configured to generate mechanical energy required for rotation of wheels mounted on the vehicle.

According to another aspect, a method for protecting circuit elements may include applying a driving voltage by a driving signal generator to a circuit element and operating the circuit element based on the driving voltage, detecting the driving voltage applied to the circuit element, comparing the driving voltage with a first reference value, detecting a differential voltage across both terminals of an inductor, to which a current output from the circuit element is applied, comparing the differential voltage with a second reference value, transmitting a control signal to the driving signal generator when the driving voltage exceeds the first reference value and the differential voltage exceeds the second reference value and operating the driving signal generator according to the control signal.

The circuit element may include at least one transistor, the at least one transistor having at least one of Bipolar Junction Transistor (BJT), thyristor, Field-Effect Transistor (FET) and Insulated Gate Bipolar mode Transistor (IGBT). The driving signal generator may be configured to apply the driving voltage to a base or gate of the at least one transistor. The operating the driving signal generator according to the control signal may include stopping that application of voltage to the circuit element by the driving signal generator, in response to the control signal and modifying the driving voltage and applying the modified driving voltage to the circuit element by the driving signal generator.

Accordingly to yet another aspect, a method for controlling a vehicle having a motor driven according to operation of at least one switching element may include applying a driving voltage by a driving signal generator to the switching element and operating the switching element based on the driving voltage, detecting the driving voltage applied to the switching element, comparing the driving voltage with a first reference value, detecting a differential voltage across both terminals of an inductor, to which a current output from the switching element is applied, comparing the differential voltage with a second reference value, transmitting a control signal to the driving signal generator when the driving voltage exceeds the first reference value and the differential voltage exceeds the second reference value and stopping the application of a driving signal to a switching element of a motor or applying a driving signal of a different voltage to the switching element of the motor by the driving signal generator, according to the control signal.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Figure 1:
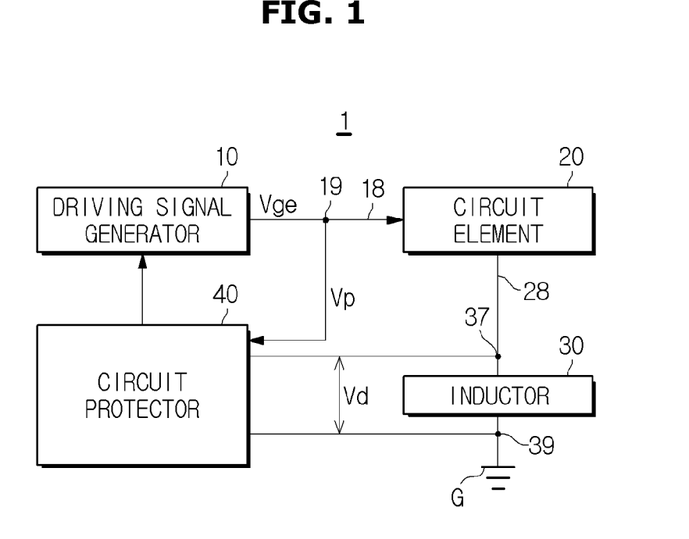
FIG. 1 is a block diagram of a circuit for protecting circuit elements, according to an exemplary embodiment of the present disclosure.

FIG. 1 is a block diagram of a circuit for protecting circuit elements, according to an exemplary embodiment of the present disclosure. Referring to FIG. 1, a circuit for protecting circuit elements 1 may include a circuit element 20 which is a target to be protected, a driving signal generator 10 configured to apply a voltage Vge required for operation of the circuit element 20 to the circuit element 20, an inductor 30 electrically connected to the circuit element 20, and a circuit protector 40 configured to protect the circuit element 20 in the circuit 1 from, for example, a short circuit.

The driving signal generator 10 may be electrically connected to at least one circuit element 20, and configured to apply an electric signal of a particular voltage Vge (hereinafter, a driving voltage) for the circuit element 20 to be operated. The voltage Vge applied from the driving signal generator 10 may be a direct current (DC) voltage or an alternate current (AC) voltage. When an AC voltage is applied to the circuit element 20, the driving voltage Vge may include an effective voltage. The driving signal generator 10 and the circuit element 20 may be configured to have the electric signal delivered on at least one signal line. The at least one signal line may be implemented with a conductive line or printed circuit.

The at least one signal line may be divided from at least one node 19. A branched signal line may be connected to the circuit protector 40. Accordingly, when the driving voltage Vge is applied to the circuit element 20 from the driving signal generator 10, a voltage Vp about equal to the driving voltage Vge may also be applied to the circuit protector 40. In other words, when a current is delivered from the driving signal generator 10 to the circuit element 20, a portion of the current is also delivered to the circuit protector 40, in which case the voltage Vp applied to the circuit protector 40 may be about equal to the driving voltage Vge.

The circuit element 20 is a target to be protected by the circuit protector 40 from, for example, a short circuit. The circuit element 20 may be electrically connected to the driving signal generator 10 and configured to perform a predetermined operation based on the voltage Vge applied from the driving signal generator 10. In particular, the circuit element 20 may perform the predetermined operation to correspond to the applied voltage Vge.

Furthermore, the circuit element 20 may also be electrically connected to the inductor 30. In particular, a signal line may be formed between the circuit element 20 and the inductor 30. The signal line may include a conductive wire or circuit. While a single circuit element 20 is included in the circuit 1 as an example, there may be a plurality of circuit elements 20 included in the circuit 1 in some other exemplary embodiments.

In an exemplary embodiment, the circuit element 20 may include a switching element. The switching element may be configured to forward or block a received electric signal. In addition, the switching element may include a transistor. When the circuit element 20 is a transistor, the voltage Vge of the driving signal generator 10 may be applied to the base or gate of the transistor. In e exemplary embodiments of the present disclosure, the transistor may be implemented by at least one of Bipolar Junction Transistor (BJT), thyristor, Field-Effect Transistor (FET) and Insulated Gate Bipolar mode Transistor (IGBT). The FET may include a Metal Semiconductor Field-Effect Transistor (MESFET) or Metal Oxide Semiconductor Field Effect Transistor (MOSFET).

The inductor 30 may be electrically connected to the circuit element 20 and may prevent a rapid current change by inducing a voltage in proportion to an amount of change in the applied current. In some exemplary embodiments, the inductor 30 may include a variable inductor. The inductor 30 may also be implemented with a coil. Further, the inductor 30 may have a first end connected to the circuit element 20 and a second end connected to another circuit element, part, device, or ground.

A signal line that connects the first end of the inductor 30 and the circuit element 20 may be divided from a node 37, and a branched line may be connected to the circuit protector 40. A signal line that connects the second end of the inductor 30 and the other circuit element, part, device, or ground may be divided from a node 39, and a branched line may also be connected to the circuit protector 40. Accordingly, a portion of the current before applied to the inductor 40 and a portion of the current output from the inductor 40 may be delivered to the circuit protector 40.

The circuit protector 40 may be configured to determine whether the circuit element 20 is damaged or determine a possibility of damage based on the electric signal delivered on the signal line branched from the signal line that connects the driving signal generator 10 and the circuit element 20 and the electric signal delivered on the signal line branched from the plurality of nodes 37, 39 at both terminals of the inductor 30, and generate and output a control signal for the driving signal generator 10 based on the determination result.

Figure 2:
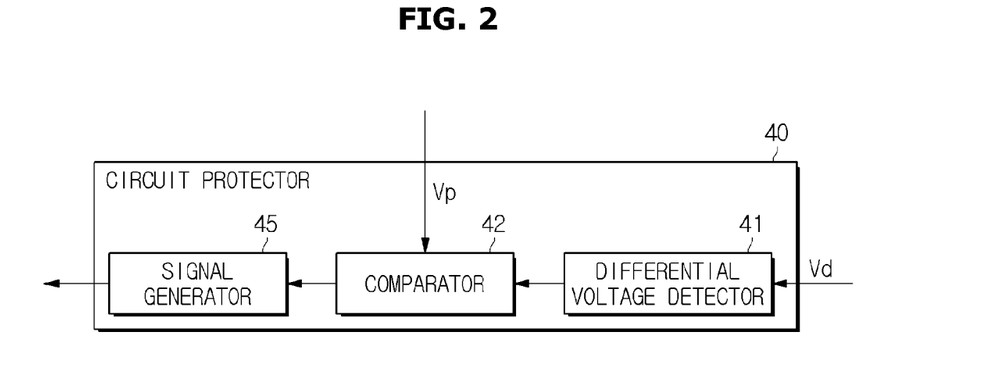
FIG. 2 is a block diagram of a circuit protector, according to an exemplary embodiment of the present disclosure.

FIG. 2 is a block diagram of a circuit protector, according to an exemplary embodiment of the present disclosure. Referring to FIG. 2, the circuit protector 40 may include a differential voltage sensor 41, a comparator 42, and a signal generator 45.

The differential voltage sensor 41 may be configured to detect a differential voltage Vd across a plurality of nodes 37, 39 at both terminals of the inductor 30. The differential voltage Vd refers to a difference in voltage between the plurality of nodes. The differential voltage sensor 41 may be configured to output and transmit the detected differential voltage Vd to the comparator 42. The differential voltage sensor 41 may be implemented with a sensor or instrument device typically designed to detect the voltage difference between two nodes.

Further, the comparator 42 may be configured to receive electric signals from both the driving signal generator 10 and the differential voltage sensor 41 and either transmit or block (e.g., permit or restrict the signal transmission) an electric signal to the signal generator 45 based on the received electric signals. The comparator 42 may be configured to compare the voltage Vp about equal to the driving voltage Vge output from the driving signal generator 10 with a predetermined reference value (hereinafter, a first reference value). In particular, the first reference value may be arbitrarily defined by the user or designer. The first reference value may be defined in various ways based on the types of the driving signal generator 10 and/or circuit element 20. The first reference value may be a first reference voltage. The comparator 42 may be configured to obtain a comparison result by comparing the voltage Vp with the first reference voltage. Accordingly, whether an overcurrent or overvoltage is applied from the driving signal generator 10 to the circuit element 20 may be measured.

The comparator 42 may also be configured to compare the differential voltage Vd delivered from the differential voltage sensor 41 with another predetermined reference value (hereinafter, a second reference value). The second reference value may be arbitrarily defined by the user or designer. The second reference value may or may not be the same as the first reference value. The second reference value may be defined in various ways based on the types of the driving signal generator 10, circuit element 20, and/or inductor 30. Likewise, the second reference value may include a second reference voltage, and the comparator 42 may be configured to obtain a comparison result by comparing the differential voltage Vp with the second reference voltage.

When the circuit 1 is shorted, the amount of change in current flowing around the both terminals of the inductor 30 di/dt increases, and the voltage induced accordingly, V=Lx*di/dt, increases as well. Accordingly, when the circuit 1 is shorted, the differential voltage Vd increases. The comparator 42 may thus be configured to determine whether the circuit 1 has been shorted by determining whether the differential voltage Vd is greater than a particular threshold, i.e., the second reference value. When the voltage Vp equal or approximate to the driving voltage Vge is equal to or greater than the first reference voltage, and at the same time the differential voltage Vd is equal to or greater than the second reference value, the comparator 42 may be configured to generate and transmit an electric signal to the signal generator 45 according to the comparison result. In other words, the comparator 42 may be configured to output an electric signal when the voltages of the both input electric signals exceed their reference values.

On the contrary, when the voltage Vp that is about equal to the driving voltage Vge is less than the first reference voltage or when the differential voltage Vd is less than the second reference voltage, the comparator 42 may be configured to not generate any electric signal in response to the comparison result. Accordingly, the signal generator 45 may not receive any electric signal from the comparator 42.

Even when the driving signal generator 10 outputs an overvoltage/overcurrent, the circuit 1 may not be shorted.

Further, due to noise, for example, the voltage Vge of the driving signal generator 10 may exceed the first reference value. Even when the voltage Vge of the driving signal generator 10 exceeds the first reference value, the comparator 42 may further be configured to determine whether the differential voltage Vd across both terminals of the inductor 30 is greater than the second reference voltage, as described above, and thus prevent incorrect determination based on the output of the overvoltage/overcurrent of the driving signal generator 10. Accordingly, the circuit protector 40 may be configured to more accurately detect whether the circuit 1 is shorted.

The comparator 42 may be implemented with various types of comparator circuits that may be considered by the designer. The signal generator 45 may be configured to receive an electric signal that corresponds to the comparison result from the comparator 42. In response to receiving the electric signal from the comparator 42, the signal generator 45 may be configured to generate and output a control signal that corresponds to the received electric signal. The electric signal output from the signal generator 45 may be transmitted to the driving signal generator 10.

In an exemplary embodiment, the driving signal generator 10 may be configured to stop generating the driving signal according to the control signal transmitted from the signal generator 45. In another exemplary embodiment, the driving signal generator 10 may be configured to generate driving signals with different voltages and/or currents depending on the control signal. Particularly, the driving signal generator 10 may be configured to output a driving signal with a relatively low voltage and/or current than the voltage/current of the existing output driving signal.

Figure 3:
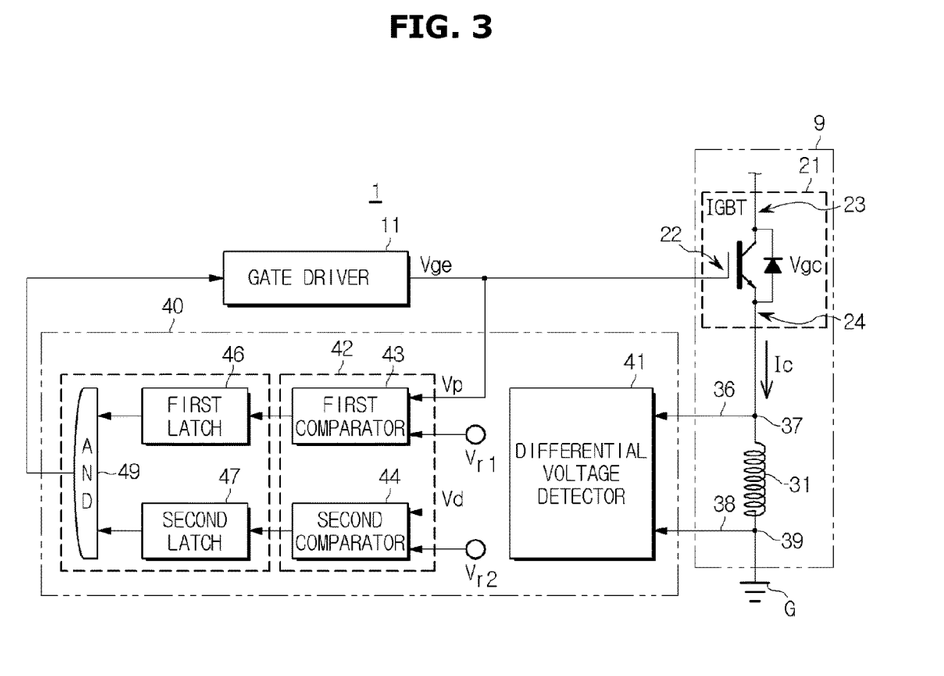
FIG. 3 is a circuit diagram of a circuit for protecting circuit elements, according to an exemplary embodiment of the present disclosure.

The circuit for protecting circuit elements 1 will now be described in more detail. FIG. 3 is a circuit diagram of a circuit for protecting circuit elements, according to an exemplary embodiment of the present disclosure. Referring to FIG. 3, the circuit element 20 may be an IGBT 21. The IGBT 21 is a circuit element capable of performing rapid switching even at low driving power.

Moreover, the IGBT 21 may include a gate 22, a collector 23, and an emitter 24, and the collector 23 and emitter 24 are conductive based on a voltage applied to the gate 22. Accordingly, a current may or may not flow between the collector 23 and the emitter 24. The driving signal generator 10 may be a gate driver 11 configured to apply a particular voltage Vge to the gate 22 to operate the IGBT 21. The gate driver 11 may be connected to the gate 22 of the IGBT 21 via a line. Accordingly, when the driving voltage Vge of a particular level is output from the gate driver 11, the driving voltage Vge may be applied to the gate 22 to operate the IGBT 21. The line from the driving signal generator 10 may be divided at a node, and a branched line may be electrically connected to a first comparator 43.

Once the driving voltage Vge output from the driving signal generator 10 is applied to the gate 22, the collector 23 and emitter 24 of the IGBT 21 become conductive, and accordingly, a current Ic flows between the emitter 24 of the IGBT 21 and a coil 31. The inductor 30 may be implemented with the coil 31. Inside the coil 31, a non-magnetic substance may be inserted, or a ferromagnetic substance, such as iron or ferrite may be installed. Alternatively, the inside of the coil 31 may be mounted with no additional elements.

A first terminal of the coil 31 may be electrically connected to the emitter 24 of the IGBT 21 via at least one line. The line that connects the emitter 24 and the one terminal of the coil 31 may be divided at a node 37. A branched line may be connected to a differential voltage sensor 41. A second terminal of the coil 31 may be connected to various parts or devices via at least one line, or may be connected to the ground G, as shown in FIG. 3. The line connected to the other terminal of the coil 31 may be divided at a node 39. A branched line may also be connected to a differential voltage sensor 41. The current flowing between the emitter 24 of the IGBT 21 and the first terminal of the coil 31 may increase or decrease, and accordingly, a parasitic capacitance may be generated in the coil 31. As described above, the circuit protector 40 may include the differential voltage sensor 41, the comparator 42, and the signal generator 45.

A voltage (hereinafter, a first voltage) at between the emitter 24 and the first terminal of the coil 31 may be applied to the differential voltage sensor 41 via a line divided from the line that connects the emitter 24 and the first terminal of the coil 31. In other words, the differential voltage sensor 41 may be configured to obtain information regarding the voltage applied to the first terminal of the coil 31. Furthermore, a voltage (hereinafter, a second voltage) at the second terminal of the coil 31 may be applied to the differential voltage sensor 41 via a line divided from the line connected to the second terminal of the coil 31. In other words, the differential voltage sensor 41 may be configured to obtain information regarding an output voltage of the coil 31.

Furthermore, the differential voltage sensor 41 may be configured to obtain a difference between the input first and second voltages. The differential voltage sensor 41 may be configured to measure the first and second voltages separately and calculate a difference between the measured first and second voltages. Alternatively, the differential voltage sensor 41 may be configured to determine the difference between the first and second voltages using various methods that may be considered by the designer. In some exemplary embodiments, the differential voltage sensor 41 may be configured to calculate a ratio between the first and second voltages.

The differential voltage Vd obtained by the differential voltage sensor 41 may be transmitted to a second comparator 44 via a circuit or wire. The comparator 42 may include the first comparator 43 and the second comparator 44. The first comparator 43 may be configured to receive the voltage Vp about equal to the driving voltage Vge output from the gate driver 11, compare the received voltage Vp with a first reference voltage Vr1, and output an electric signal based on the comparison result. In an exemplary embodiment, the first comparator 43 may be designed to output an electric signal when the received voltage Vp exceeds the first reference voltage Vr1. In some exemplary embodiments, the first comparator 43 may be configured to output an electric signal even when the received voltage Vp is equal to the first reference voltage Vr1. The first comparator may be electrically connected to a first latch 46, and the electric signal output from the first comparator 43 may be transmitted to the first latch 46 as the received voltage Vp exceeds the first reference voltage Vr1.

The second comparator 44 may be configured to receive the differential voltage Vd output from the differential voltage sensor 41 and compare the received differential voltage Vd with a second reference voltage Vr2. The second comparator 44 may then be configured to output an electric signal based on the comparison result. In an exemplary embodiment, the second comparator 44 may be configured to output an electric signal when the differential voltage Vd exceeds the second reference voltage Vr2. In some exemplary embodiments, the second comparator 44 may be configured to output an electric signal even when the differential voltage Vd is equal to the second reference voltage Vr2. The second comparator 44 may be electrically connected to a second latch 47, and the electric signal output from the second comparator 44 may be transmitted to the second latch 47 via a wire or circuit.

In an exemplary embodiment, the signal generator 45 may include the first latch 46, the second latch 47, and an AND gate element. The first and second latches 46 and 47 may include input terminals connected to the first and second comparators 43 and 44, respectively, and may be activated when the electric signals output from the first and second comparators 43 and 44 are applied to their respective input terminals. In response to receiving the electric signal from the first comparator 43, the first latch 46 may be activated to output an electric signal that corresponds to the electric signal transmitted from the first comparator 43. Similarly, in response to receiving the electric signal from the second comparator 44, the second latch 47 may be configured to output an electric signal that corresponds to the electric signal transmitted from the second comparator 44. An output terminal of the first latch 46 may be connected to one of both input terminals of the AND gate element 49, and an output terminal of the second latch 47 may be connected to the other of the both input terminals of the AND gate element 49.

When electric signals are input to the both input terminals of the AND gate element 49, the AND gate element 49 may be configured to output an electric signal, i.e., a control signal, that corresponds to the input electric signals. In other words, when an electric signal output from the output terminal of the first latch 46 is input to one input terminal (e.g., a first input terminal) of the AND gate element 49 and an electric signal output from the output terminal of the second latch 47 is input to the other input terminal (e.g., a second input terminal) of the AND gate element 49, the AND gate element 49 may be configured to output a control signal. When no electric signal is applied to at least one of the input terminals of the AND gate element 49, the AND gate element 49 may be prevented from outputting any electric signal.

As described above, since an electric signal may be input to one input terminal of the AND gate element 49 when the input voltage Vp is greater than the first reference voltage Vr1 and an electric signal may be input to the other input terminal of the AND gate element 49 when the differential voltage Vd is greater than the second reference voltage Vr2, the AND gate element 49 may be configured to output a control signal when the input voltage Vp, i.e., the driving voltage Vge output from the gate driver 11, is greater than the first reference voltage Vr1 and the differential voltage Vd is greater than the second reference voltage Vr2. The output control signal may be transmitted to the gate driver 11, and in response to the receiving the control signal, the gate driver 11 may be operated to correspond to the control signal, thereby preventing damage to the IGBT 21 from e.g., a short circuit. Accordingly, the circuit for protecting circuit elements 1 may be able to prevent a failure or malfunction of the IGBT 21.

Figure 4:
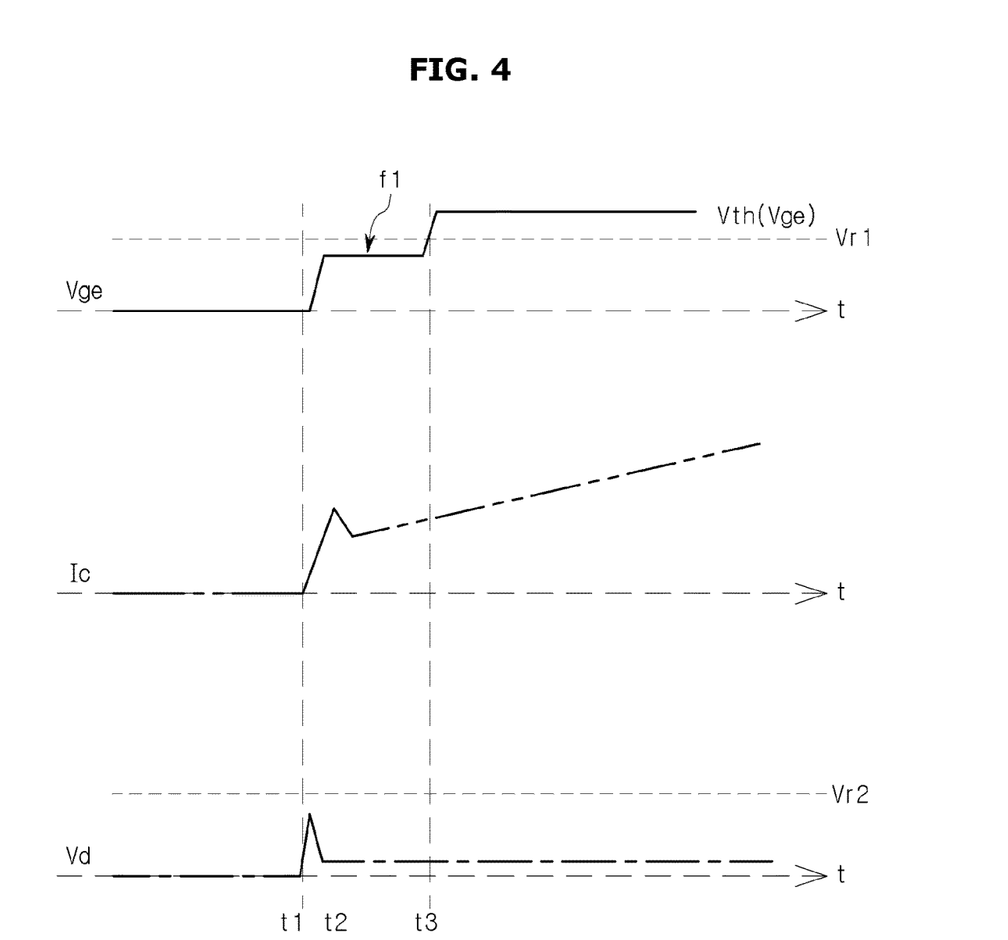
FIG. 4 shows graphs when a circuit element operates normally according to an exemplary embodiment of the present disclosure.
Figure 5:
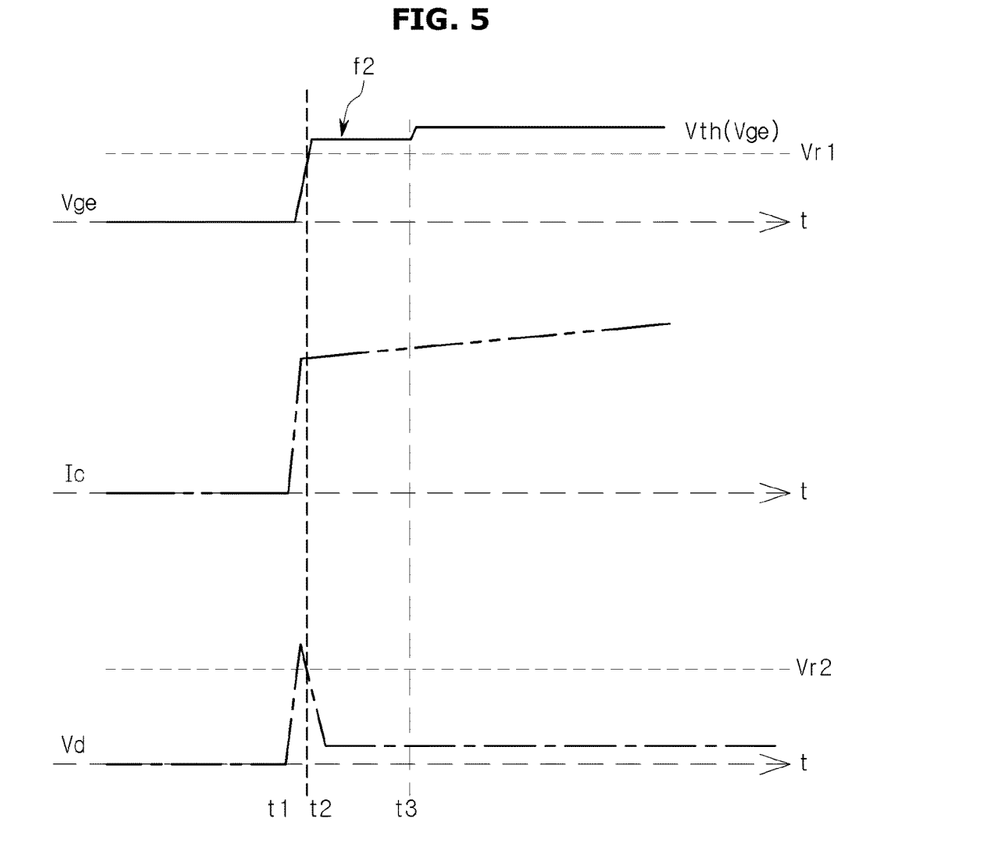
FIG. 5 shows graphs when a short circuit current is caused to a circuit element according to an exemplary embodiment of the present disclosure.

A procedure of the circuit for protecting circuit elements 1, e.g., the IGBT 21, will now be described in more detail. FIG. 4 shows graphs when a circuit element operates normally (e.g., without error, malfunction, or a short), and FIG. 5 shows graphs when a short circuit current flows in a circuit element. FIGS. 4 and 5 each show changes in voltage, current, and differential voltage in order from the top. In FIGS. 4 and 5, the x-axis denotes time, and the y-axis denotes magnitude of voltage, current, and differential voltage in order from the top.

Referring to FIG. 4, when the gate driver 11 is activated at time t1 under the external control, the gate driver 11 may be configured to output an electric signal of a particular voltage Vge. In particular, the driving voltage Vge gradually increases until time t2, and remains at a constant value f1 from time t2 to t3 to fill a voltage Vgc between the gate 22 and the collector 23 of the IGBT 21. The constant voltage f1 in a period of time (from t2 to t3) is less than the first reference value Vr1 in a normal situation (e.g., no error, malfunction, or short). The normal situation may include a situation in which the circuit element 20 may not be damaged, such as when the gate driver 11 operates normally or when the circuit 1 is not shorted.

When the gate driver 11 outputs an electric signal of a certain voltage Vge, a current Ic flowing between the emitter 24 of the IGBT 21 and the coil 31 increases accordingly. At a point of time, t2, where the driving voltage Vge remains constant in magnitude, the current temporarily decreases and then increases again. While the current Ic flowing between the emitter 24 and the coil 31 increases, a parasitic inductance increases instantaneously in a period of time (between t1 and t2) as the current Ic increases. An induced voltage and therefore, the differential voltage Vd increase accordingly. When the circuit 1 is operating normally, the magnitude of the differential voltage Vd is less than the second reference voltage Vr2.

Further, when a short circuit current occurs due to an arm-short of the IGBT 21 and thus causing a rapidly changing current to flow between the emitter 24 of the IGBT 21 and the coil 31, the IGBT 21 may be damaged. Specifically, when a substantial amount of current flows in the IGBT 21, the IGBT 21 consumes excessive power, Ic*t, where t is time, which may damage the IGBT 21. As shown in FIG. 5, when the gate driver 11 is not operating normally or the circuit 1 is shorted, the driving voltage Vge output from the gate driver 11 rapidly increases from time t1 and remains at a constant value f2 from time t2. In particular, the magnitude of the constant voltage f2 is relatively greater than the reference voltage Vr1 due to the rapid increase in the driving voltage Vge.

The current Ic flowing between the emitter 24 of the IGBT 21 and the coil 31 also rapidly increases according to the rapid increase in the driving voltage Vge during the period of time between t1 and t2. The rapid increase in the current Ic flowing between the emitter 24 and the coil 31 leads to a rapid increase in the parasitic inductance, which also leads to a rapid increase in the induced voltage. The differential voltage Vd rapidly changes accordingly during the time (from t1 to t2). Particularly, the magnitude of the differential voltage Vd is relatively greater than the second reference voltage Vr2. Accordingly, when the gate driver 11 is not normally operating or the circuit 1 is shorted, the rapid increase in the driving voltage Vge output from the gate driver 11 temporarily causes the driving voltage Vge to be greater than the first reference voltage Vr1, and accordingly, the first comparator 43 may be configured to output and transmit an electric signal to the first latch 46. The differential voltage Vd may exceed the second reference voltage Vr2 as well, and the second comparator 44 may be configured to output and transmit an electric signal to the second latch 47.

Since the first and second latches 46 and 47 both output electric signals, the AND gate element 49 may be configured to output a corresponding electric signal to the gate driver 11. In response to receiving the electric signal, the gate driver 11 may be operated to prevent damage to or stop operation of a circuit element, i.e., the IGBT 21. Accordingly, the circuit element, the IGBT 21 may be protected from a short circuit. The exemplary embodiment of FIGS. 3 to 5 uses the IGBT 21 as the circuit element 20, but it is not limited thereto. In some exemplary embodiments, the circuit for protecting circuit elements 1 may be implemented by using a e.g., MOSFET instead of the IGBT 21.

Figure 6:
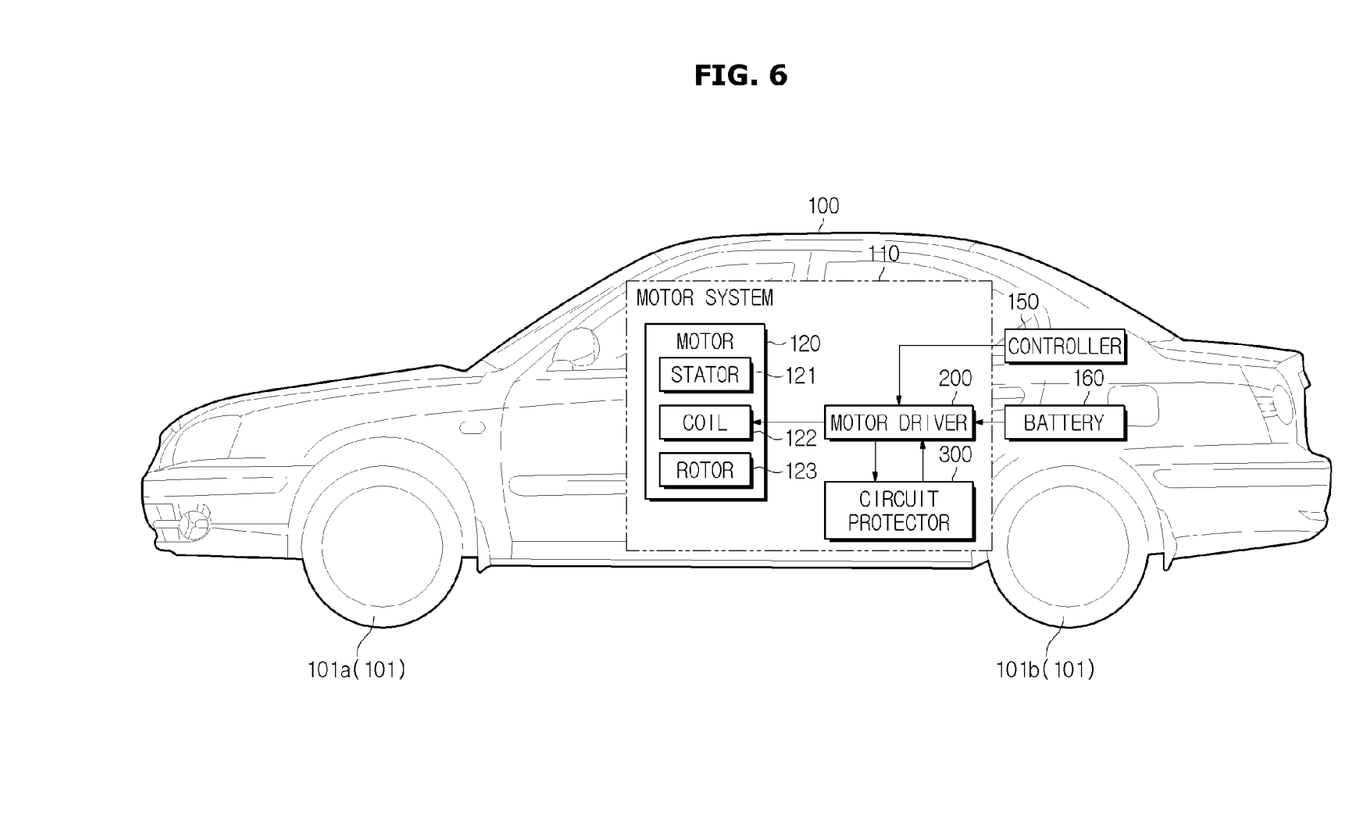
FIG. 6 is a block diagram of a vehicle, according to an exemplary embodiment of the present disclosure.

An exemplary embodiment of a vehicle, to which the circuit for protecting circuit elements is applied, will now be described in connection with FIGS. 6 and 7. FIG. 6 is a block diagram of a vehicle, according to an exemplary embodiment of the present disclosure. In some exemplary embodiments, the vehicle 100 may be a typical fossil fueled vehicle, or an electric vehicle.

The fossil fueled vehicle uses an engine to convert combustion energy of a fossil fuel to mechanical energy and uses the mechanical energy to turn the wheels 101. The electric vehicle may be a common electric vehicle that uses a motor to have power required for rotation of the wheels 101. The motor of the electric vehicle obtains power required for rotation of the wheels 101 by converting electric energy charged in a battery 160 to mechanical energy. The electric vehicle may include at least one of a typical electric vehicle (EV) that obtains power with a motor, a hybrid electric vehicle (HEV) that obtains power using both thermal energy from combustion of a fossil fuel and electric energy, and a plug-in hybrid electric vehicle (PHEV) that uses both thermal energy from combustion of a fossil fuel and electric energy and is given electric energy from outside to be charged in an embedded battery.

Referring to FIG. 6, a vehicle 100 may include a motor system 110, a controller 140, and a battery 160. The motor system 110 and the controller 140 may be connected to interact with each other via a cable or a wireless communication network. The wireless communication network may be implemented using a technology, such as Bluetooth, Wireless Fidelity (Wi-Fi), Controller Area Network (CAN), Wi-Fi Direct, Near Field Communication (NFC), etc.

Furthermore, the motor system 110 and the battery 160, or the controller 140 and the battery 160 may be electrically connected via at least one conductive wire or metal circuit, and accordingly, power may be supplied to the motor system 110 and controller 140. The motor system 110, the controller 140, and the battery 160 may be installed in an area within the vehicle 100. For example, the motor system 100 may be installed in an engine room of the vehicle 100, or between the engine room and a dashboard. The battery 160 may be installed in the engine room of the vehicle 100, or on the bottom of the vehicle 100, or in space between the rear seat and rear loading space of the vehicle 100, or in the rear loading space of the vehicle 100, but is not limited thereto.

The motor system 110 may include a motor 120, a motor driver 200, and a circuit protector 300. The motor 120 may be configured to convert electric energy to mechanical energy, i.e., rotation energy. The motor 120 may be driven for the vehicle 100 to obtain power required for various operations of the vehicle 100. The various operations of the vehicle 100 may include e.g., rotation of the wheels 1, fuel pump operation, oil pump operation, and/or adjustment of the back of a driver seat/passenger seat, which may be performed according to the operation of the motor 120. The motor 120 may be at least one of a DC motor, an AC motor, a DC brushless motor, or a linear inductive motor. Further, the motor 120 may be any different type of motor that may be considered by the designer. As shown in FIG. 6, the motor 120 may include a stator 121, a coil 122, and a rotor 123. The stator 121 may be fixedly formed on the inner side of the exterior frame of the motor 120 and located around the rotor 123. In an exemplary embodiment, the stator 121 may include a ring-shaped frame.

Figure 7:
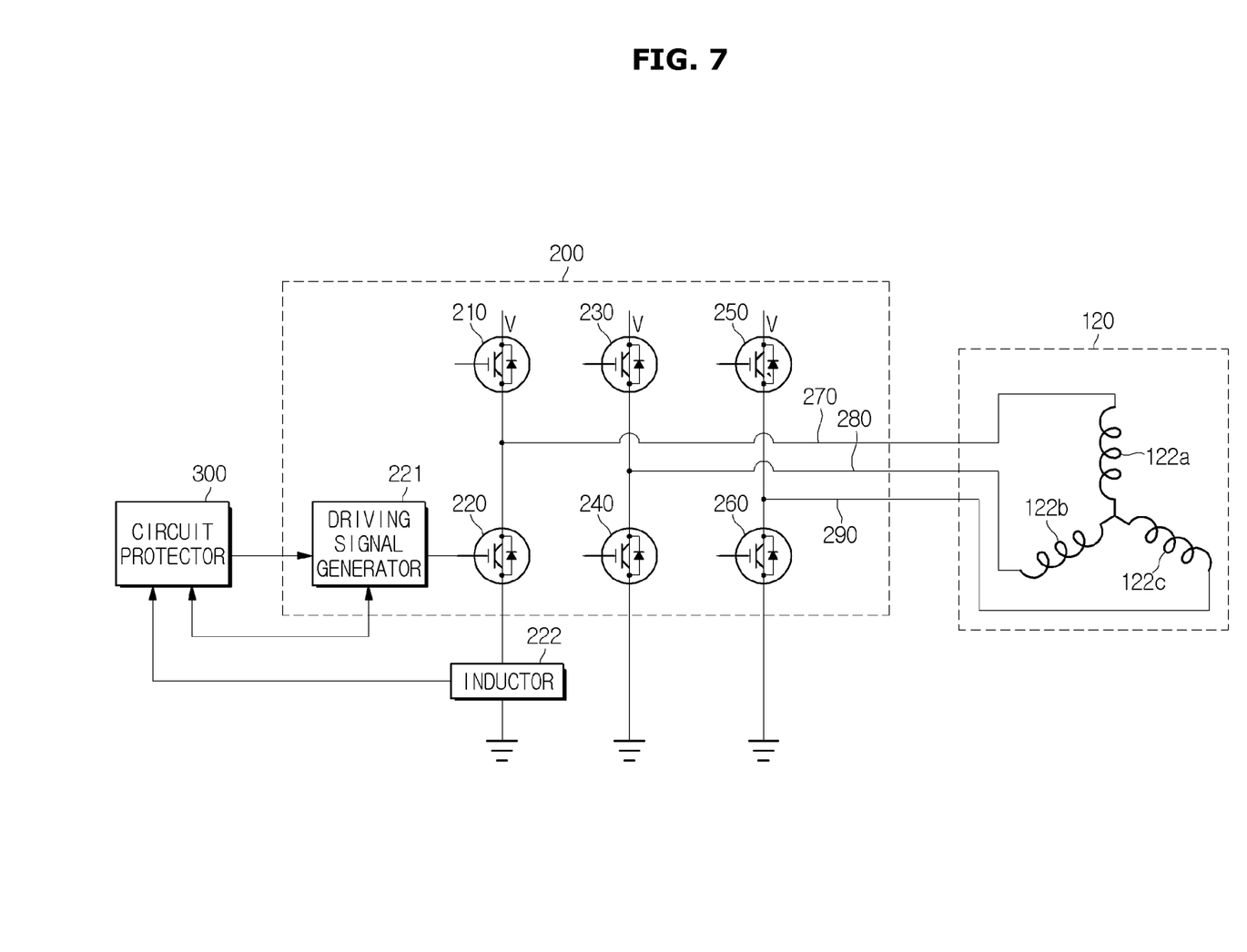
FIG. 7 is a circuit diagram of a motor system, according to an exemplary embodiment of the present disclosure.

FIG. 7 is a circuit diagram of a motor system, according to an exemplary embodiment of the present disclosure. The coil 122 may be installed to be wound around at least one projection of the stator 121 for producing magnetic fields that correspond to an applied current. The coil 122 may include a plurality of coils 122a, 122b, 122c, as shown in FIG. 7. For example, when three phased motor, the coil 122 may include three coils 122a, 122b, and 122c. The three coils 122a, 122b, and 122c may be installed at a particular point on the ring-shaped frame of the stator 121. In particular, the coils 122a, 122b, and 122c installed at the particular point on the ring-shaped frame may extend up to another point opposite the particular point.

The respective coils 122a to 122c may be electrically connected to the motor driver 200 via a circuit or conductive wires 270, 280, and 280. According to operation of the motor driver 200, an alternate current may or may not flow in the coils 122a to 122c, and accordingly, corresponding magnetic fields are produced inside the ring-shaped frame. The rotor 123 may be rotated around a particular rotation axis inside the ring-shaped frame based on the magnetic field produced around the coils 122a to 122c. The rotor 123 may be implemented using a permanent magnet. The rotation power from the rotor 123 may be delivered to parts requiring the power, e.g., wheels, fuel pump, oil pump, and/or a motor for adjusting the back of the driver seat through various other parts, such as gears or shafts.

The rotor 123 may be rotated at a particular rotation frequency. The rotation frequency of the rotor 123 may correspond to a switching frequency of the respective switching elements 210 to 260 of the motor driver 200. The switching frequency refers to the number of times that an on/off operation of the individual switching elements 210 to 260 is repeated in a unit of time. The individual switching elements 210 to 260 repeatedly start and stop operation according to the switching frequency. The motor driver 200 may be configured to receive an electric signal of a certain voltage from the battery 160, and apply a supplied current to the coil 122 of the motor 120. The motor driver 200 may be implemented using an inverter in an exemplary embodiment.

Referring back to FIG. 2, the motor driver 200 may include at least one of the switching elements 210 to 260. The individual switching elements 210 to 260 may be configured to operate selectively such that the current input from the battery 160 may be transmitted to at least two coils 122a to 122c. The switching elements 210 to 260 may be implemented using at least one of BJT, thyristor, FET, such as MOSFET, and IGBT. The switching elements 210 to 260 may be disposed in pairs 210 and 220, 230 and 240, and 250 and 260. Voltage may be applied to a first one 210, 230, 250 of each pair of the switching elements 210 and 220, 230 and 240, 250 and 260, and a second one 220, 240, 260 of each pair of them is connected to the ground.

Additionally, current may be delivered to the motor driver 200 via one 210, 230, 250 of each pair of the switching elements 210 to 260, and current that has passed the two coils 122a to 122c may be delivered out of the motor driver 200 through the second one 220, 240, 260 of each pair of the switching elements 210 to 260. In particular, based on which pair of the switching elements 210 and 220, 230 and 240, or 250 and 260 is operating, AC current flows in a particular coil in a particular direction. For example, when the first and fourth switching elements 210 and 240 are operating, AC current flows sequentially in the first coil 122a and second coil 122b, and when the first and sixth switching elements 210 and 260 are operating, the current flows sequentially in the first coil 122a and third coil 122c.

Furthermore, when the third and sixth switching elements 230 and 260 are operating, the current flows sequentially in the second coil 122b and third coil 122c; when the second and third switching elements 220 and 230 are operating, the current flows sequentially in the second coil 122b and first coil 122a; when the fourth and fifth switching elements 240 and 250 are operating, the current flows sequentially in the third coil 122c and second coil 122b. In addition, when the second and fifth switching elements 220 and 250 are operating, the current flows sequentially in the third coil 122c and first coil 122a. Accordingly, based on the operation of the switching elements 210 to 260, an AC current flows in two of the plurality of coils 122a to 122c disposed at different positions in a particular direction, and accordingly, magnetic fields corresponding to the magnitude and direction of the AC current are sequentially produced in the internal space of the motor 120, enabling the rotor 123 to be rotated.

Referring to FIG. 7, at least one switching element, e.g., the second switching element 220 may be electrically connected to the driving signal generator 221 and inductor 222. In particular, the driving signal generator 221 may be connected to the gate of the second switching element 220, and the inductor 222 may be connected to the emitter of the second switching element 220.

As described above, the driving signal generator 221 may be configured to apply a predetermined voltage Vge to the gate of the second switching element 220, and a certain current Ic flows in the inductor 222. The driving signal generator 221 may include e.g., a gate driver. The gate driver may be implemented using at least one integrated chip. The voltage Vge output from the driving signal generator 221 may also be applied to the circuit protector 300. Furthermore, the voltage across both terminals of the inductor 222 may be applied to the circuit protector 300, which in turn determines a differential voltage across the both terminals of the inductor 222 based on the voltage across the both terminals of the inductor 222.

Similarly, the circuit protector 300 may be configured to compare the voltage Vge output from the driving signal generator 221 and the differential voltage across the both terminals of the inductor 222 with the first and second reference values (also called first and second reference voltages), respectively, and generate and transmit a control signal to the driving signal generator 221 according to the comparison results. The circuit protector 300 may be configured to generate and transmit a control signal to the driving signal generator 221 when the voltage Vge output from the driving signal generator 221 is greater than the first reference voltage and the differential voltage across both terminals of the inductor 222 is greater than the second reference voltage.

In some exemplary embodiments, the circuit protector 300 may be implemented with the differential voltage sensor, comparator, and signal generator, as shown in FIG. 2. More specifically, as shown in FIG. 3, the circuit protector 300 may include a differential voltage sensor connected to both terminals of the inductor 222, a plurality of comparators connected to the driving signal generator 221 and the differential voltage sensor, a plurality of latches each connected to each of the plurality of comparators, and an AND gate element connected to the plurality of latches. The operations of the respective components were described above, so the details thereof will be omitted in the following description.

The driving signal generator 221 may be configured to stop applying the driving voltage Vge to the second switching element 200 or adjust the applied driving voltage Vge, according to the received control signal. Accordingly, since the driving signal generator 221 is operated based on the operation of the circuit protector 300, the individual switching elements 210 to 260 in the motor driver 200 may be protected more accurately and rapidly. For example, the driving signal generator 221 may be configured to operate to prevent at least one switching element 210 to 260 from being damaged due to an arm short.

Although FIG. 7 shows the second switching element 220 electrically connected to the driving signal generator 221 and inductor 222, other switching elements 210, 230 to 260 may be electrically connected to and installed with gate drivers and inductors in the same manner or in a partially modified manner. The gate drivers and inductors connected to the devices 210, 230 to 260 may operate as described above. Furthermore, the gate drivers and inductors installed with the other switching elements 210, 230 to 260 may also be electrically connected to the circuit protector in the same manner as described above or in a partially modified manner. The circuit protector may be configured to operate the gate drivers installed with the other switching elements 210, 230 to 260 based on the driving voltage and differential voltage, as described above.

Furthermore, the controller 150 may be configured to execute general operation of the vehicle 100. For example, the controller 150 may be configured to transmit a control signal to at least one of the motor driver 200 of the motor system 110 and the circuit protector 300 to execute operations of them. The controller 150 may be implemented by using a processor that uses at least one semiconductor chip and associated parts. The processor may be e.g., a central processing unit (CPU) or a micro control unit (MCU). For the vehicle 100, the processor may be a vehicle control device. However, any type of processor separately arranged to perform various operations and processes may be used for the controller 150.

The controller 150 may be configured to operate according to a predetermined program. The predetermined program may be stored in a storage device arranged separately from the controller 150. In an exemplary embodiment, the controller 150 may be designed to allow the circuit protector 300 to perform the aforementioned operation. In other words, the circuit protector 300 may be replaced by the controller 150. The voltage Vge output from the driving signal generator 221 or the voltage output from across the both terminals of the inductor 222 may be delivered to the controller 150, which may in turn, be configured to determine whether the switching element 220 has a fault based on a predefined definition in advance.

The battery 160 may be configured to supply electric energy to individual parts requiring electric energy. For example, the battery 160 may be configured to supply power for the motor driver 112 to drive a motor. In other words, the battery 160 may be configured to supply power for the driving signal generator 221 to operate the individual switching elements 210 to 260. Furthermore, the battery 160 may be configured to supply power to the circuit protector 300 as necessary to allow the circuit protector 300 to perform various operations required to protect the switching elements 210 to 260.

Figure 8:
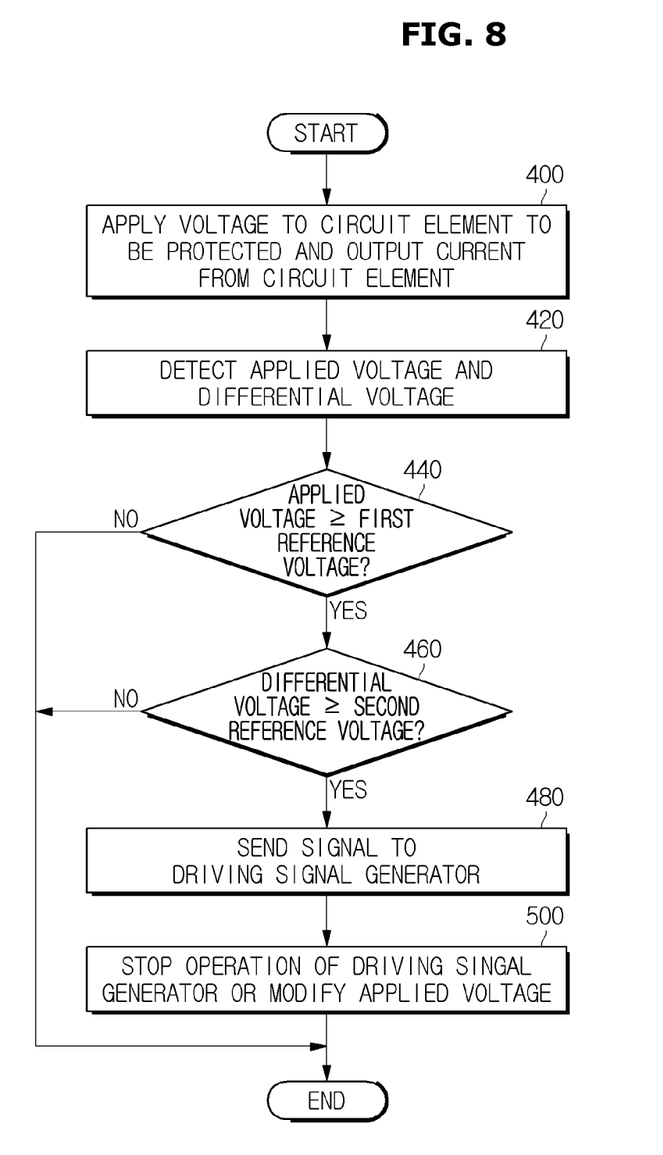
FIG. 8 is a flowchart illustrating a method for protecting circuit elements, according to an exemplary embodiment of the present disclosure.

A method for protecting circuit elements and method for controlling a vehicle will now be described with reference to FIG. 8. FIG. 8 is a flowchart illustrating a method for protecting circuit elements, according to an exemplary embodiment of the present disclosure. The method to be described herein below may be executed by an overall controller having a processor and a memory.

Referring to FIG. 8, first, a driving voltage may be applied to a circuit element to be protected, e.g., a switching element, and a current may be output from the circuit element, in 400. Application of the voltage to the circuit element may be performed by the driving signal generator. The current output from the circuit element may be delivered to the inductor electrically connected to the circuit element. At the same time as in 300 or at a different time, a driving voltage applied to the circuit element may be detected and determined, in 420. Furthermore, at the same time as or at a different time from detection of the driving voltage, a voltage across both terminals of the inductor may be measured, and a differential voltage across the both terminals of the inductor may be determined. Detection and determination of the driving voltage and differential voltage may be performed by the circuit protector operated by the controller.

The driving voltage and the differential voltage may be sequentially compared with their respective reference voltages, in 440, 460. In particular, the driving voltage may be compared with a first reference voltage, in 440. When the driving voltage is greater than the first reference voltage (yes in 440), the differential voltage may be compared with a second reference voltage. When the driving voltage is less than the first reference voltage (no in 440), the existing operation remains the same. For example, the driving voltage generator may continue applying the existing driving voltage according to what is predetermined.

When the differential voltage is greater than the second reference voltage (yes in 460), a control signal may be transmitted to the driving signal generator, in 480. When the differential voltage is less than the second reference voltage (no in 460), no control signal is generated for the driving voltage generator. When the control signal is transmitted to the driving signal generator, the driving signal generator may be configured to perform a corresponding operation in response to receiving the control signal, in 500. For example, the driving signal generator may be configured to stop applying the driving voltage to the circuit element to be protected. In another example, the driving signal generator may be configured to change the driving voltage applied to the circuit element to be protected.

While the exemplary embodiment of FIG. 8 shows that the driving voltage is compared with the first reference voltage and then the differential voltage is compared with the second reference voltage, the sequence of comparison is not limited thereto. For example, the differential voltage may be compared with the second reference voltage before the driving voltage is compared with the first reference voltage. Furthermore, comparison of the driving voltage with the first reference voltage and comparison of the differential voltage with the second reference voltage may be performed simultaneously.

The method for protecting circuit elements may be applied equally or through some modification to a method for controlling a vehicle. When the method for protecting circuit elements is applied to the method for controlling the vehicle, the circuit element to be protected may be a switching element of a motor driver, e.g., a BJT, MOSFET, or IGBT, disposed within the motor system of the vehicle. The motor system of the vehicle may be disposed within an electric vehicle for obtaining power to drive wheels, without being limited thereto. The motor system may be any of various types of motor systems arranged to perform functions performed by the vehicle. In addition, the driving signal generator may be a gate driver connected to the gate (or base) of the switching element for supplying a driving voltage to the gate (or base). The circuit protector may be implemented using an extra circuit, or any control device disposed within the vehicle, e.g., a vehicle control device or MCU.

According to exemplary embodiments of the circuit and method for protecting circuit elements and vehicle having the circuit and method for controlling the vehicle, a short circuit may be appropriately overcome by more rapidly and more reliably detecting overcurrent applied to a circuit element. According to exemplary embodiments of the circuit and method for protecting circuit elements and vehicle having the circuit and method for controlling the vehicle, it may be possible to design a circuit that may protect circuit elements at relatively low cost. According to exemplary embodiments of the circuit and method for protecting circuit elements and vehicle having the circuit and method for controlling the vehicle, a fault caused by a short circuit may be promptly detected, thereby more appropriately protecting a circuit, such as a power module, from damage even when a current density increases. Additionally, a circuit may be protected against damage, thereby saving expenses of maintenance and/or repair of the vehicle.

What is claimed is:

1. A circuit for protecting circuit elements, comprising:
a circuit element;
a driving signal generator configured to apply a driving voltage to the circuit element;
an inductor with a first terminal electrically connected to the circuit element; and
a circuit protector configured to obtain information regarding the driving voltage applied to the circuit element and a differential voltage across the first terminal and a second terminal of the inductor, compare the driving voltage applied to the circuit element with a first reference voltage, compare the differential voltage with a second reference voltage, and transmit a control signal to the driving signal generator according to the comparison results.

2. The circuit for protecting circuit elements of claim 1, wherein the circuit protector includes a differential voltage sensor configured to determine a difference between a voltage applied to the inductor and a voltage output from the inductor.

3. The circuit for protecting circuit elements of claim 2, wherein the circuit protector includes a first comparator configured to compare the driving voltage with the first reference voltage, and a first latch configured to operate based on an output of the first comparator.

4. The circuit for protecting circuit elements of claim 3, wherein the circuit protector includes a second comparator connected to the differential voltage sensor and configured to compare the differential voltage with the second reference voltage, and a second latch configured to operate based on an output of the second comparator.

5. The circuit for protecting circuit elements of claim 4, wherein the circuit protector further includes an AND gate element connected to the first and second latches.

6. The circuit for protecting circuit elements of claim 1, wherein the circuit element includes at least one transistor, the transistor having at least one selected from the group consisting of: Bipolar Junction Transistor (BJT), thyristor, Field-Effect Transistor (FET), and Insulated Gate Bipolar mode Transistor (IGBT).

7. The circuit for protecting circuit elements of claim 6, wherein the driving signal generator is configured to apply the driving voltage to a base or gate of the at least one transistor.

8. The circuit for protecting circuit elements of claim 1, wherein the driving signal generator is configured to stop applying voltage to the circuit element or change the driving voltage, in response to a control signal sent from the circuit protector.

9. A vehicle, comprising:
   at least one circuit element;
   a driving signal generator configured to apply a driving voltage to the at least one circuit element; and
   a controller configured to receive the driving voltage applied to the circuit element, measure a change in voltage of an electric signal output from the circuit element, compare the driving voltage applied to the circuit element with a first reference voltage, compare the change in voltage with a second reference voltage, and transmit a control signal to the driving signal generator based on the comparison results.

10. The vehicle of claim 9, wherein the circuit element includes at least one switching element of a motor driver connected to a coil of a motor.

11. The vehicle of claim 10, wherein the motor is configured to generate mechanical energy required for rotation of wheels mounted on the vehicle.

12. A method for protecting circuit elements, comprising:
   applying, by a controller, a driving voltage by a driving signal generator to a circuit element and operating the circuit element based on the driving voltage;
   detecting, by the controller, the driving voltage applied to the circuit element;
   comparing, by the controller, the driving voltage with a first reference value;
   detecting, by the controller, a differential voltage across both terminals of an inductor, to which a current output from the circuit element is applied;
   comparing, by the controller, the differential voltage with a second reference value;
   transmitting, by the controller, a control signal to the driving signal generator when the driving voltage exceeds the first reference value and the differential voltage exceeds the second reference value; and
   operating, by the controller, the driving signal generator according to the control signal.

13. The method of claim 12, wherein the circuit element includes at least one transistor, the at least one transistor having at least one selected from the group consisting of: Bipolar Junction Transistor (BJT), thyristor, Field-Effect Transistor (FET), and Insulated Gate Bipolar mode Transistor (IGBT).

14. The method of claim 13, wherein the driving signal generator is configured to apply the driving voltage to a base or gate of the at least one transistor.

15. The method of claim 12, wherein operating the driving signal generator according to the control signal includes:
   stopping, by the controller, applying voltage to the circuit element by the driving signal generator, in response to the control signal; and
   modifying, by the controller, the driving voltage and applying the modified driving voltage to the circuit element by the driving signal generator.

16. A method for controlling a vehicle having a motor driven according to operation of at least one switching element, comprising:
   applying, by a controller, a driving voltage by a driving signal generator to the switching element and operating the switching element based on the driving voltage;
   detecting, by the controller, the driving voltage applied to the switching element;
   comparing, by the controller, the driving voltage with a first reference value;
   detecting, by the controller, a differential voltage across both terminals of an inductor, to which a current output from the switching element is applied;
   comparing, by the controller, the differential voltage with a second reference value;
   transmitting, by the controller, a control signal to the driving signal generator when the driving voltage exceeds the first reference value and the differential voltage exceeds the second reference value; and
   stopping, by the controller, applying a driving signal to a switching element of a motor or applying a driving signal of a different voltage to the switching element of the motor by the driving signal generator, according to the control signal.

* * * * *